(12) United States Patent
Dinter et al.

(10) Patent No.: US 7,334,206 B2
(45) Date of Patent: Feb. 19, 2008

(54) CELL BUILDER FOR DIFFERENT LAYER STACKS

(75) Inventors: Matthias Dinter, Holzkirchen (DE); Juergen Dirks, Holzkirchen (DE); Roland Klemt, Forstern (DE)

(73) Assignee: LSI Logic Corporation, Milpitas, CA (US)

( * ) Notice: Subject to any disclaimer, the term of this patent is extended or adjusted under 35 U.S.C. 154(b) by 413 days.

(21) Appl. No.: 11/010,745

(22) Filed: Dec. 13, 2004

(65) Prior Publication Data

US 2006/0129962 A1    Jun. 15, 2006

(51) Int. Cl.
G06F 17/50    (2006.01)
H01L 25/00    (2006.01)

(52) U.S. Cl. ............... 716/9; 716/8; 716/11; 716/14; 326/101

(58) Field of Classification Search ............ 716/1, 716/3–13, 17; 703/6; 326/102
See application file for complete search history.

(56) References Cited

U.S. PATENT DOCUMENTS

| 6,414,852 | B1 * | 7/2002 | Mizuno ............... 361/820 |
| 6,421,816 | B1 * | 7/2002 | Ishikura ............... 716/7 |
| 6,430,734 | B1 * | 8/2002 | Zahar ............... 716/12 |
| 6,516,456 | B1 * | 2/2003 | Garnett et al. ............... 716/8 |
| 6,523,159 | B2 * | 2/2003 | Bernstein et al. ............... 716/10 |
| 6,553,544 | B2 * | 4/2003 | Tanaka et al. ............... 716/3 |
| 6,574,786 | B1 * | 6/2003 | Pohlenz et al. ............... 716/17 |
| 6,606,735 | B1 * | 8/2003 | Richardson et al. ............... 716/5 |
| 6,611,946 | B1 * | 8/2003 | Richardson et al. ............... 716/5 |
| 6,629,291 | B1 * | 9/2003 | Houghton et al. ............... 716/1 |
| 6,691,290 | B1 * | 2/2004 | Wu ............... 716/4 |
| 6,785,875 | B2 * | 8/2004 | Beerel et al. ............... 716/6 |
| 6,892,368 | B2 * | 5/2005 | Li et al. ............... 716/5 |
| 6,910,200 | B1 * | 6/2005 | Aubel et al. ............... 716/9 |
| 6,925,627 | B1 * | 8/2005 | Longway et al. ............... 716/13 |
| 6,951,007 | B2 * | 9/2005 | Kaida ............... 716/12 |
| 7,032,207 | B2 * | 4/2006 | Kurose et al. ............... 716/12 |
| 7,051,309 | B2 * | 5/2006 | Crosetto ............... 716/10 |
| 7,076,410 | B1 * | 7/2006 | Kerzman et al. ............... 703/6 |
| 7,076,757 | B2 * | 7/2006 | Hirata ............... 716/10 |
| 7,078,936 | B2 * | 7/2006 | Catalasan et al. ............... 326/102 |
| 7,096,436 | B2 * | 8/2006 | Bednar et al. ............... 716/1 |
| 7,174,520 | B2 * | 2/2007 | White et al. ............... 716/4 |
| 2006/0129962 | A1 * | 6/2006 | Dinter et al. ............... 716/11 |

FOREIGN PATENT DOCUMENTS

JP    06069339 A  *  3/1994

* cited by examiner

*Primary Examiner*—Stacy A Whitmore
*Assistant Examiner*—Helen Rossoshek
(74) *Attorney, Agent, or Firm*—Christopher P. Maiorans PC

(57) ABSTRACT

A library cell, a method and/or a system for adding the cell to a circuit is disclosed. The method generally comprises a first step for generating a final layout of the cell having an area of interest in at least one upper layer within a first layer stack used for the circuit, the first layer stack including at most all of a plurality of physical layers available for fabrication. A second step may include placing the final layout in the circuit. A third step may route a network of the circuit through the cell using the at least one upper layer and avoiding the area of interest according to at least one of a plurality of rules.

20 Claims, 4 Drawing Sheets

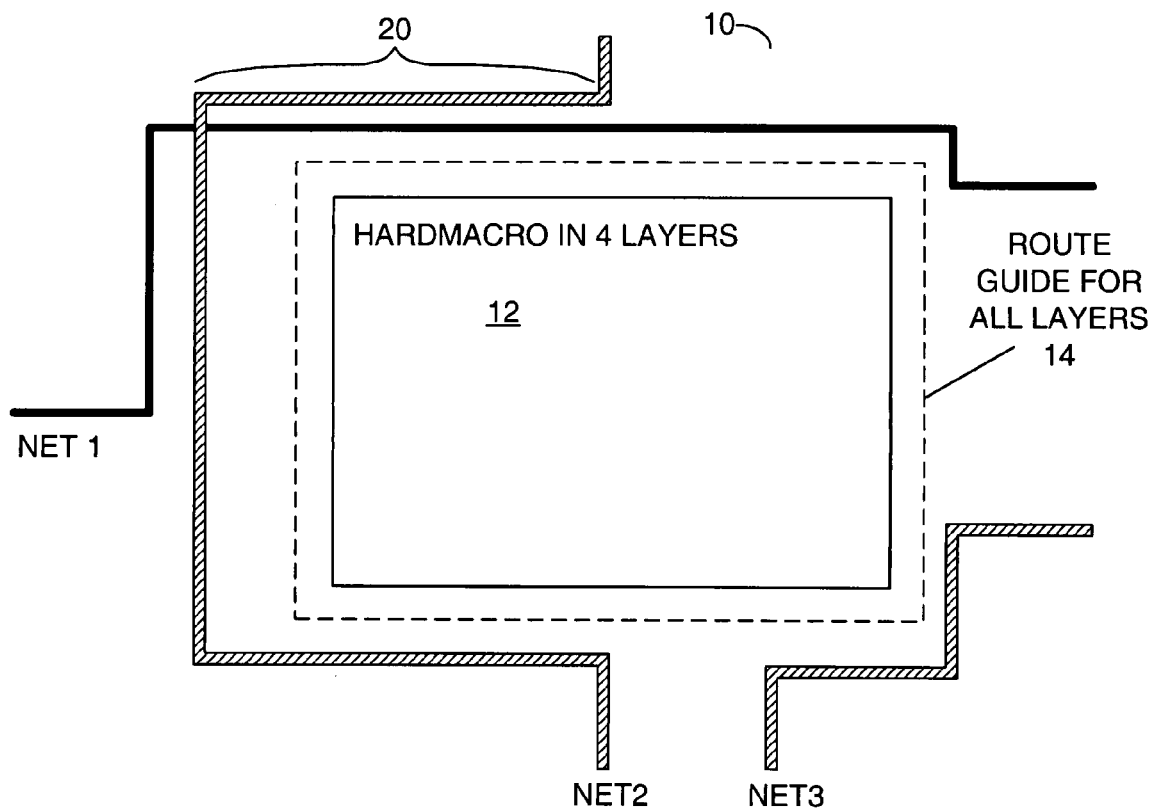
FIG. 1
(CONVENTIONAL)

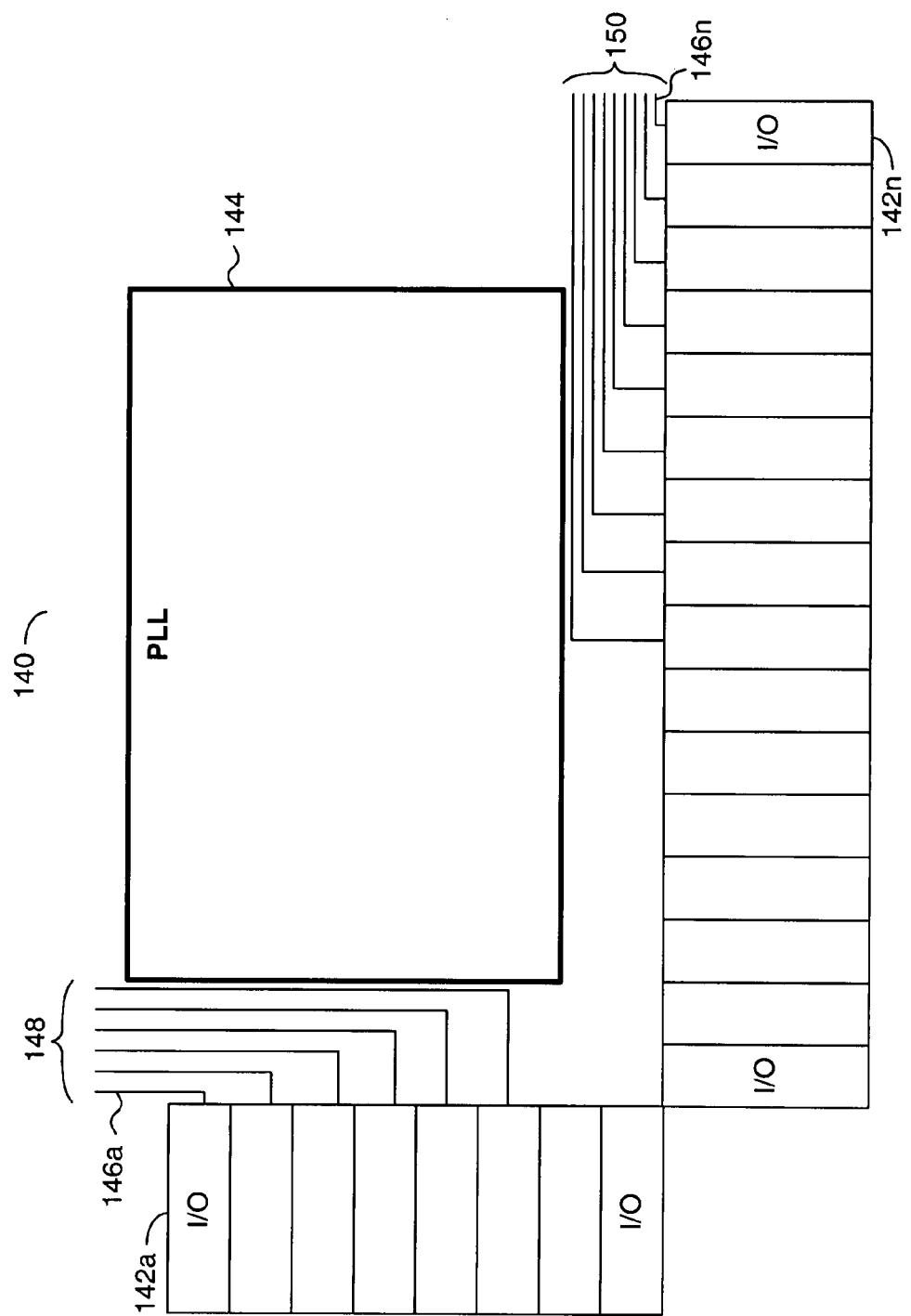
FIG. 5
(CONVENTIONAL)

CELL BUILDER FOR DIFFERENT LAYER STACKS

FIELD OF THE INVENTION

The present invention relates to circuit layouts generally and, more particularly, to a cell builder for different layer stacks.

BACKGROUND OF THE INVENTION

Digital logic and mixed signal hardmacros are normally developed for backend implementation in a lowest possible layer stack. A layer stack defines either a particular subset of physical layers or all of the physical layers in a technology available to a circuit designer. However, looking at a number of different possible layer stacks available for conventional technologies, a lot of unsupported layer stacks exist. In most cases, unsupported layer stacks have no rules available for handling by automatic place-and-route software tools.

All of the layers not used in a hardmacro are commonly completely blocked for top level automatic network routing. Route guides can prevent a network of a circuit, not included as an inherent part of the hardmacro, from being routed across any portion of the hardmacro. The completely blocked layers cause network paths to go around the hardmacro adding significant wire delay. A lot of routing space in the circuit is also lost and a lot of pseudo routing violations can appear. As such, automatic routing routines are negatively influenced by the blockages. Furthermore, conventional automated routing tools do not always pay attention to the route guides. Therefore, a high number of routing violations can be caused which slow down both the routing process and a search-and-repair process. Manually adjusting routes to pass over the hardmacros is time consuming and susceptible to human mistakes.

Referring to FIG. 1, a block diagram of a conventional layout for a circuit 10, including a conventional hardmacro 12, is shown. The hardmacro 12 includes a route guide (i.e., boundary 14) for all physical layers that blocks automatic routing across the hardmacro 12 on any layer. The route guide 14 causes the vertical and horizontal routes to go around the hardmacro. For example, a horizontally oriented network (i.e., NET 1) is routed up a left side, across a top side and down a right side of the hardmacro 12 due to the route guide 14. A vertically oriented network (e.g., NET 2) is routed left along a bottom side, up the left side, and right along the top side of the hardmacro 12 due to the route guide 14. A third network (i.e., NET 3) is routed right along the bottom side and up along the right side of the hardmacro 12. Routing around the hardmacro 12 can cause timing problems due to lengthy wires and congestion (i.e., region 20) where the networks NET 1 and NET 2 are in close proximity.

SUMMARY OF THE INVENTION

The present invention concerns a library cell, a method and/or a system for adding the cell to a circuit. The method generally comprises a first step for generating a final layout of the cell having an area of interest in at least one upper layer within a first layer stack used for the circuit, the first layer stack including at most all of a plurality of physical layers available for fabrication. A second step may include placing the final layout in the circuit. A third step may route a network of the circuit through the cell using the at least one upper layer and avoiding the area of interest according to at least one of a plurality of rules.

The objects, features and advantages of the present invention include providing a cell builder for different layer stacks that may (i) handle core designs in a single layout, (ii) handle mixed signal designs in a single layout, (iii) reduce congestion as compared to conventional approaches, (iv) remove human error, (v) reduce pseudo routing violations as compared with conventional approaches, (vi) provide faster routing than conventional approaches and/or (vii) provide shorter turn-around times than conventional approaches.

BRIEF DESCRIPTION OF THE DRAWINGS

These and other objects, features and advantages of the present invention will be apparent from the following detailed description and the appended claims and drawings in which:

FIG. 1 is a block diagram of a conventional layout for a circuit including a conventional hardmacro;

FIG. 5 is a block diagram of an example conventional layout for a third circuit.

DETAILED DESCRIPTION OF THE PREFERRED EMBODIMENTS

Figure 2:
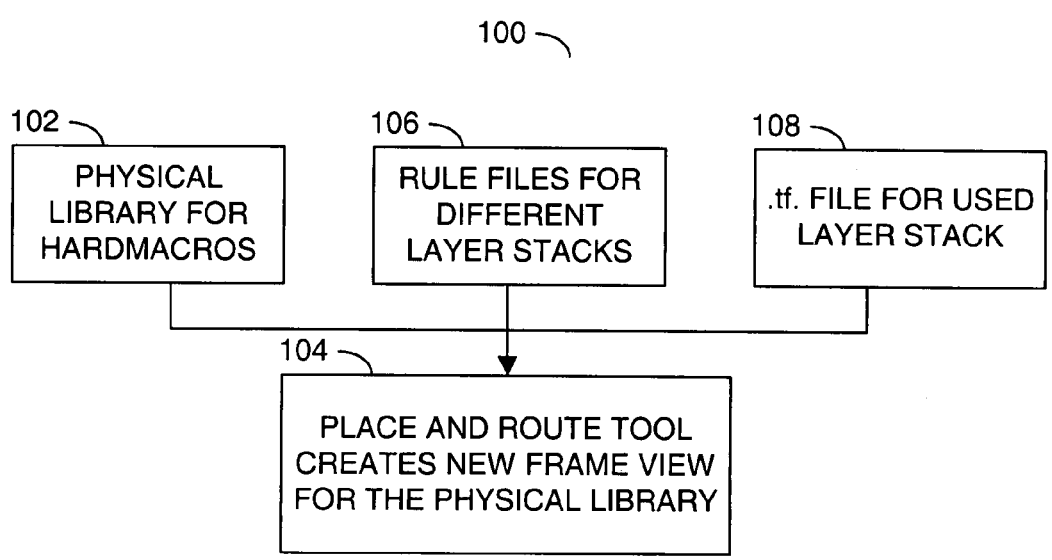
FIG. 2 is an example functional flow diagram of a method for adding a hardmacro to a circuit in accordance with a preferred embodiment of the present invention.

Referring to FIG. 2, an example functional flow diagram of a method 100 for adding a hardmacro to a circuit is shown in accordance with a preferred embodiment of the present invention. The present invention generally builds layout deliverables such as digital cores, analog circuitry, mixed signal modules and other library cells in a flexible way according to the layer stack used for circuit fabrication. The resulting library cells generally do not block all unused layers within a boundary of the cell thus freeing routing resources for use by automated software routing tools.

The method 100 generally comprises a step (or block) 102, a step (or block) 104, a step (or block) 106 and a step (or block) 108. A design engineer generally develops a layout for a hardmacro (or cell) in an initial layer stack and generates an extra rule file or set of rule files including a routing rules for one or more upper layers (e.g., step 102). The initial layer stack generally comprises a smallest number of physical layers available for fabrication in a given technology. For example, the physical layers may include, but are not limited to n-type diffusion layers, p-type diffusion layers, gate layers, polysilicon layers and one or more metal layers. In some cases, the initial layer stack may include up to all of the physical layers. Upon design completion, the cell may be stored in a physical library for hardmacros.

The rule (or information) file generally includes all information about shielding of sensitive parts, such as analog circuitry and other areas of interest, inside the hardmacro. The rule file may also include information regarding metal utilization for blocking areas within a boundary of the cell where appropriate. Some rule files may be associated with the individual layers of the layer stacks. For example, a particular layer may be dedicated to filling deep vias and thus includes a rule prohibiting the routing of signal traces on the particular layer.

The design engineer may deliver the normal layout libraries for the newly designed cell plus the rule files for post design checking (PDC). Another engineer may use a software place-and-route tool to build a frame view of the normal cell layout (e.g., step 104). A frame view is generally an abstract layout view of a cell or circuit showing blockages, pins and contacts in the various layers. The resulting frame view may be referred to as a final layout for the cell.

Generation of the final cell layout may include information from the rule files generated specifically for the cell and one or more rule files generated for the different physical layers for different layer stacks (e.g., step 106). The build process may also include a file (e.g., a ".tf" file) defining the physical layers in a specific layer stack used to build up a chip or circuit (e.g., step 108). The resulting frame view of the hardmacro may include layers that coordinate with the actual layers to be used during fabrication. The final cell layout may be stored back into the physical library of hardmacros for future use.

The method 100 generally permits the same hardmacro cell layout to be adapted for use in different circuits created with different technologies. For example, the step 104 may generate a first final cell layout using a first layer stack having two routable metal layers. The step 104 may also generate a second final cell layout using a second layer stack having three routable metal layers. Both final cell layouts may be derived from the same normal cell layout, but may utilize different routing tracks across and near the cell due to the difference in available metal layers.

Figure 3:
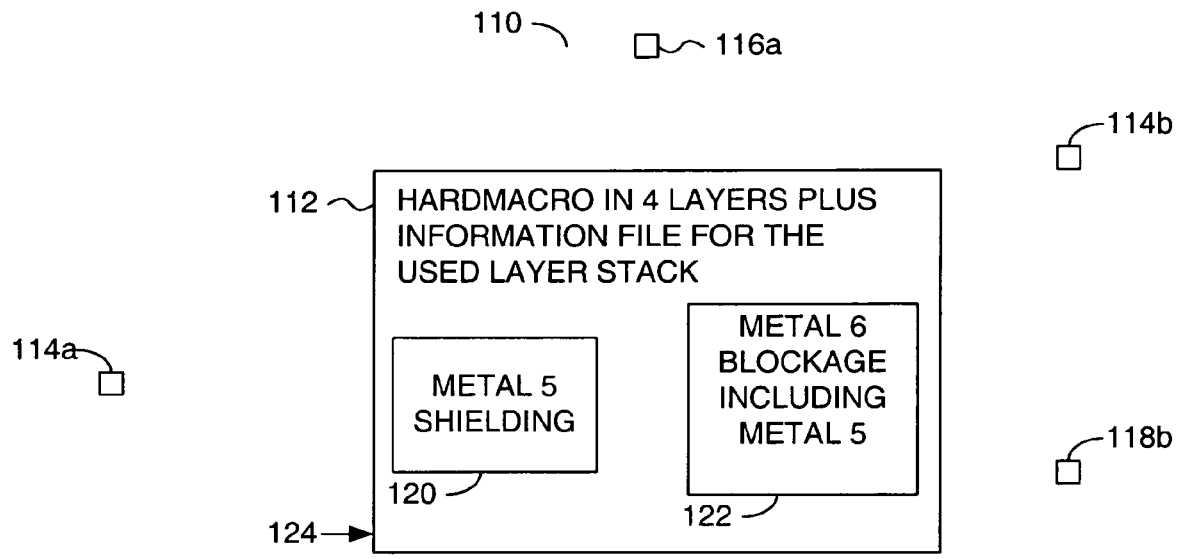
FIG. 3 is a block diagram of an example layout of a second circuit.

Referring to FIG. 3, a block diagram of an example layout of a circuit 110 is shown. The block diagram may be in the form of a frame view. A final layer stack for the circuit 110 may include at least eight layers. The circuit 110 generally comprises a hardmacro cell 112 in the process of being added, a first set of routing endpoints 114a to 114b, a second set of routing endpoints 116a to 116b and a third set of routing endpoints 118a-118b. The initial layout of the hardmacro cell 112 may utilize only the lower four layers of the layer stack.

The frame view of the cell 112 may be generated by the method 100. A rule file for one or more upper layers (e.g., a layer 5 and a layer 6) may be generated as part of the step 102. In the example shown, the rule file includes a first area of interest 120 and a second area of interest 122, both completely within an outer boundary 124 of the cell 112. Another rule file may be associated with another upper layer (e.g., layer 8) of the layer stack in use and may be applicable over the entire area of the circuit 110.

A rule for the first area of interest 120 may define a shielding rule. Generally, a shielding rule may establish an electromagnetic isolation criteria for the associated area. For example, the shielding rule for the area 120 may limit a distance between the area 120 and a closest routed network in the metal layer 5. The shielding rule may extend in three-dimensions to avoid cross coupling signals from other layers into the area of interest. A rule for the second area of interest 122 may define a blocking rule. Generally, a blocking rule may prohibit any traces from being routed through the associated area. For example, the second rule may provide metal blockage for both the metal layer 5 and the metal layer 6. A third rule 126 for the metal layer 8 may prohibit automatic signal routing anywhere in the layer 8.

Figure 4:
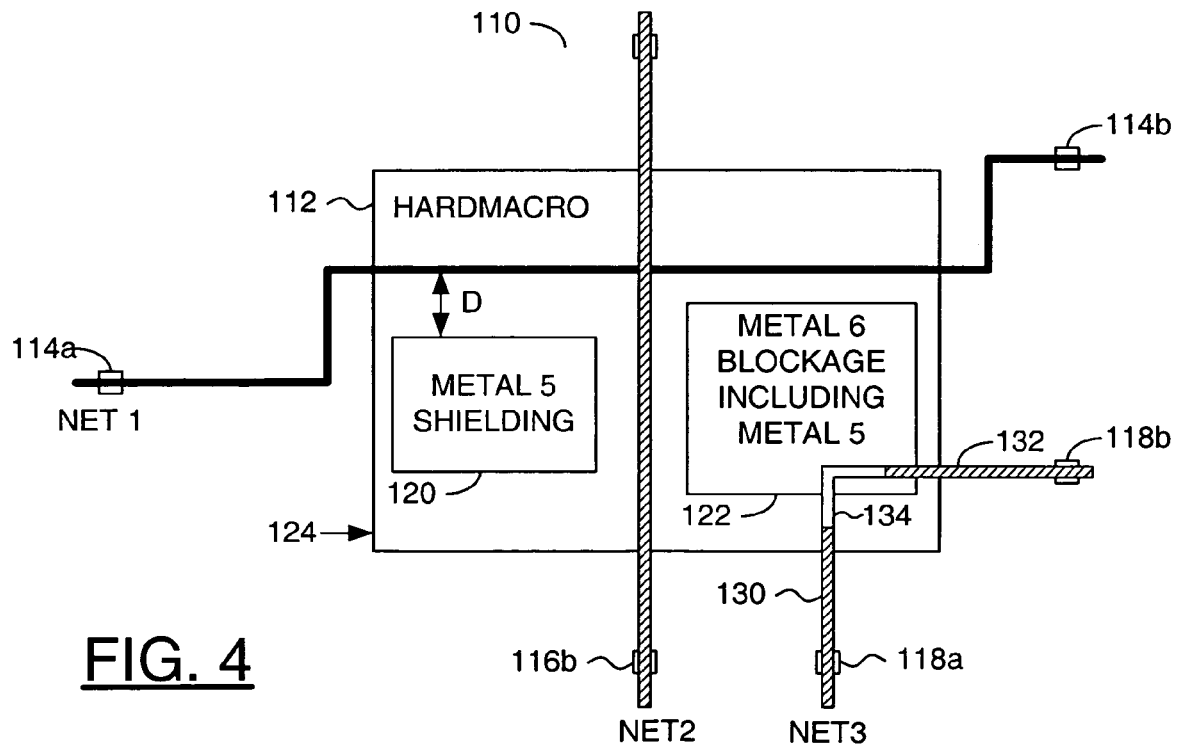
FIG. 4 is a block diagram of an example layout for the second circuit shown after an automatic place and route process.

Referring to FIG. 4, a block diagram of an example layout for the circuit 110 is shown after an automatic place and route process. The automatic place and route process (e.g., step 104 in FIG. 2) may incorporate a first network (e.g., NET 1) connecting the first endpoints 114a and 114b. A second network (e.g., NET 2) may be generated connecting the second endpoints 116a and 116b. A third network (e.g., NET 3) may be generated connecting the third endpoints 118a and 118b.

Routing of the network NET 1 may be accomplished completely in the metal layer 5 according to the shielding rule for area 120. In the example shown, the network NET 1 may be automatically routed through the cell boundary 124, but no closer than a predetermined distance (e.g., D) from the area 120. Routing of the network NET 2 may be accomplished completely in the metal layer 6 according to the blocking rule for area 122. In the example shown, the network NET 2 may be automatically routed across the cell 112 while avoiding the area 122. Routing of the network NET 3 may be accomplished using both the metal layer 6 and a metal layer 7 according to the block rule for the area 122. In particular, the network NET 3 may enter (e.g., section 130) and exit (e.g., section 132) the cell boundary 124 in the metal layer 6. However, due to the blockage rule of the area 122, the NET 3 may pass over the area 122 in the metal layer 7 (e.g., section 134) where no blocking rule exists.

Comparing FIG. 1 and FIG. 4 generally illustrates that the present invention may provide wire tracks that may be shorter, less complex and better isolated from each other. For example, the paths of the networks NET 1 and NET 2 in FIG. 4 are not running parallel each other as in region 20 of FIG. 1. Overall congestion of the networks NET 1, NET 2 and NET 3 may also be reduced in FIG. 4 as compared to FIG. 1. Furthermore, the routing tracks used for the networks in FIG. 1 may be free in FIG. 4 for routing other networks.

Referring to FIG. 5, a block diagram of an example conventional layout for a circuit 140 is shown. The circuit 140 generally comprises multiple input/output (I/O) cells 142a-142n, a phase lock loop (PLL) cell 144 and multiple I/O networks 146a-146n. A layout of the circuit 140 generally illustrates a worst case situation where the I/O cells 142a-142n are closely positioned in a corner (e.g., a lower-left corner) of a die. In a conventional approach, all of the I/O networks 146a-146n connecting to the I/O cells 142a-142n may be limited to lanes 148 and 150 to route around the PLL cell 144. As shown in the example, there is insufficient room in the lanes 148 and 150 to accommodate all of the I/O networks 146a-146n. Therefore, the PLL cell 144 should be repositioned to the upper right to expand the lanes 148 and 150. However, repositioning the PLL cell 144 wastes space in the circuit 140, can cause congestion and could increase die size, which is expensive.

Figure 6:
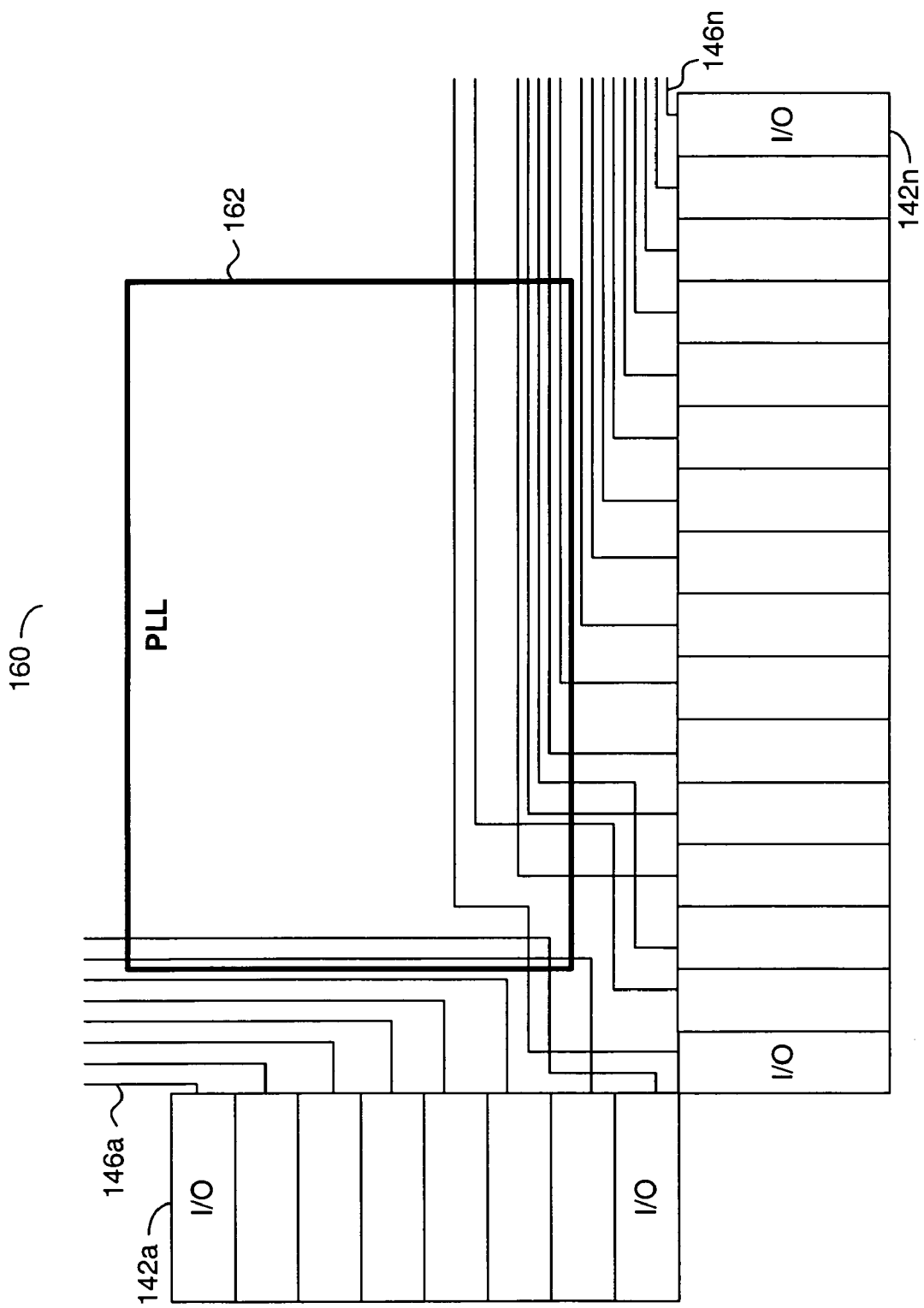
FIG. 6 is a block diagram of an example layout for the third circuit after the described invention was used.

Referring to FIG. 6, a block diagram of an example layout of for a circuit 160 is shown. The circuit 160 generally comprises the multiple I/O cells 142a-142n, the multiple I/O networks 146a-146n and a PLL cell 162 utilizing the present invention. The PLL cell 162 may include one or more rules that allow the I/O networks 146a-146n to be routed through an area occupied by the PLL cell 162. As such, the PLL cell 162 may be positioned relatively close to the corner of the die as compared to the conventional PLL cell 144 in FIG. 5.

The function performed by the flow diagram of FIG. 2 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, Platform ASICs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for adding a cell to a circuit, comprising the steps of:
    (A) generating an initial layout of said cell utilizing an initial layer stack, said initial layer stack having a subset of a plurality of physical layers available in a fabrication technology;
    (B) generating a first final layout of said cell utilizing a first layer stack, (i) said first layer stack including more of said physical layers than said initial layer stack, (ii) said first final layout of said cell having an area of interest in at least one upper layer, (iii) said at least one upper layer belonging to said first layer stack and not said initial layer stack, and (iv) said first final layout residing in a library;
    (C) placing said first final layout of said cell in a circuit layout of said circuit; and
    (D) routing a network of said circuit through said first final layout of said cell using said at least one upper layer and avoiding said area of interest according to at least one rule of a plurality of rules, (i) said at least one rule defining a characteristic of said area of interest, and (ii) said circuit layout residing in a computer medium.

2. The method according to claim 1, wherein step (A) comprises the sub-step of:
    storing said initial layout of said cell in said library.

3. The method according to claim 1 wherein step (B) further comprises the sub-step of:
    generating said first final layout from (i) said initial layout, (ii) said first layer stack and (iii) said at least one rule.

4. The method according to claim 3, further comprising the step of:
    generating a second final layout of said cell from (i) said initial layout and (ii) a second layer stack, said second layer stack using a different combination of said physical layers than said first layer stack.

5. The method according to claim 1, wherein step (D) comprises the sub-step of:
    routing said network completely in said at least one upper layer through said first final layout.

6. The method according to claim 1, wherein step (D) comprises the sub-step of:
    routing said network (i) partially in said at least one upper layer within a boundary of said first final layout and (iii) partially in another of said physical layers within said boundary of said first final layout.

7. The method according to claim 1, wherein said rules comprise a blockage rule that prevents said network from passing through said area of interest in said at least one upper layer.

8. The method according to claim 1, wherein said rules comprise a shielding rule defining a minimal level of electromagnetic isolation between said area of interest and said network.

9. The method according to claim 1, wherein said rules comprise a layer rule that is both (i) associated with said first layer stack and (ii) independent of said area of interest.

10. The method according to claim 1, further comprising a storage medium storing a computer program comprising the steps (A) through (D).

11. A system comprising:
    a library storing an initial layout of a cell utilizing an initial layer stack, said initial layer stack having a subset of a plurality of physical layers available in a fabrication technology; and
    a storage medium recording a software tool configured to (i) generate a final layout of said cell utilizing a first layer stack, (a) said first layer stack including more of said physical layers than said initial layer stack, (b) said final layout having an area of interest in at least one upper layer, (c) said at least one upper layer belonging to said first layer stack and not said initial layer stack, and (d) store said final layout in said library (ii) place said final layout in a circuit layout of said circuit and (iii) automatically route a network of said circuit through said final layout of said cell using said at least one upper layer and avoiding said area of interest according to at least one rule of a plurality of rules, (a) said at least one rule defining a characteristic of said area of interest and (b) said circuit layout residing in a computer medium.

12. The system according to claim 11, further comprising a rule database in communication with said software tool and configured to store said rules.

13. The system according to claim 11, further comprising a layer database in communication with said software tool and configured to store a plurality of definitions of said physical layers.

14. The system according to claim 11, wherein said rules comprise a blockage rule that prevents said network from passing through said area of interest in said at least one upper layer.

15. The system according to claim 11, wherein said rules comprise a shielding rule defining a minimal level of electromagnetic isolation between said area of interest and said network.

16. The system according to claim 11, wherein said rules comprise a layer rule that is both (i) associated with said first layer stack and (ii) independent of said area of interest.

17. A library cell comprising:
    a final layout (i) derived from an initial layout utilizing an initial layer stack, said initial layer stack having a subset of a plurality of physical layers available in a fabrication technology, and (ii) utilizing a first layer stack, said first layer stack including more of said physical layers than said initial layer stack; and
    an area of interest (i) in at least one upper layer, said at least one upper layer belonging to said first layer stack and not said initial layer stack, and (ii) configured such that an automatic routing of a network through a circuit layout incorporating said final layout uses said at least one upper layer and avoids said area of interest according to at least one rule of a plurality of rules, said at least one rule defining a characteristic of said area of interest.

18. The library cell according to claim 17, wherein said at least one rule prevents said network from passing proximate said area of interest in said at least one upper layer.

19. The library cell according to claim 17, further comprising a rule file configured to store said at least one rule for said area of interest.

20. The library cell according to claim 17, wherein said area of interest comprises analog circuitry.

* * * * *